(12) United States Patent
Choi et al.

(10) Patent No.: US 9,397,124 B2
(45) Date of Patent: Jul. 19, 2016

(54) ORGANIC LIGHT-EMITTING DIODE DISPLAY WITH DOUBLE GATE TRANSISTORS

(71) Applicant: Apple Inc., Cupertino, CA (US)

(72) Inventors: Jae Won Choi, Cupertino, CA (US); MinKyu Kim, Cupertino, CA (US); Shih Chang Chang, Cupertino, CA (US); Young Bae Park, San Jose, CA (US); John Z. Zhong, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/559,618

(22) Filed: Dec. 3, 2014

(65) Prior Publication Data

US 2016/0163745 A1 Jun. 9, 2016

(51) Int. Cl.
*H01L 27/12* (2006.01)
*H01L 27/32* (2006.01)

(52) U.S. Cl.
CPC ........ *H01L 27/1251* (2013.01); *H01L 27/1222* (2013.01); *H01L 27/1225* (2013.01); *H01L 27/1255* (2013.01); *H01L 27/3211* (2013.01); *H01L 27/3248* (2013.01); *H01L 27/3276* (2013.01)

(58) Field of Classification Search
CPC ............ H01L 27/1251; H01L 27/1222; H01L 27/1225; H01L 27/1255; H01L 27/3211; H01L 27/3248; H01L 27/3276
See application file for complete search history.

(56) References Cited

U.S. PATENT DOCUMENTS

| | | | |
|---|---|---|---|
| 7,675,117 B2* | 3/2010 | Atanackovic | H01L 29/4908 257/366 |
| 7,804,095 B2* | 9/2010 | Sato | H01L 27/1214 257/52 |
| 7,833,851 B2 | 11/2010 | Kuwabara et al. | |
| 8,174,015 B2* | 5/2012 | Jeong | G06F 3/0412 257/347 |
| 8,586,979 B2* | 11/2013 | Son | H01L 29/42384 257/369 |
| 8,698,707 B2 | 4/2014 | Yamashita et al. | |
| 8,779,417 B2 | 7/2014 | Hayashi et al. | |
| 8,853,016 B2 | 10/2014 | Park et al. | |
| 9,019,187 B2* | 4/2015 | Moon | G09G 3/3685 345/100 |
| 9,129,927 B2* | 9/2015 | Gupta | H01L 27/3262 |
| 9,147,719 B2* | 9/2015 | Kim | H01L 27/326 |
| 2014/0091996 A1 | 4/2014 | Moon et al. | |
| 2014/0110706 A1* | 4/2014 | Yamazaki | H01L 29/7869 257/43 |
| 2015/0048360 A1* | 2/2015 | Misaki | G02F 1/136213 257/43 |
| 2015/0060814 A1* | 3/2015 | Noh | H01L 27/3265 257/40 |
| 2015/0084946 A1* | 3/2015 | Shim | G09G 3/3258 345/212 |
| 2016/0071919 A1* | 3/2016 | Chen | G09G 3/3225 257/40 |
| 2016/0087022 A1* | 3/2016 | Tsai | H01L 27/3276 257/40 |

* cited by examiner

*Primary Examiner* — Ida M Soward
(74) *Attorney, Agent, or Firm* — Treyz Law Group, P.C.; G. Victor Treyz; Joseph F. Guihan

(57) ABSTRACT

An organic light-emitting diode display may have an array of pixels. Each pixel may have an organic light-emitting diode and thin-film transistor circuitry that controls current flow through the organic light-emitting diode. The thin-film transistor circuitry may include silicon thin-film transistors and semiconducting-oxide thin-film transistors. Double gate transistor structures may be formed in the transistors of the thin-film transistor circuitry. A double gate transistor may have a semiconductor layer sandwiched between first and second dielectric layers. The first dielectric layer may be interposed between an upper gate and the semiconductor layer and the second dielectric layer may be interposed between a lower gate and the semiconductor layer. Capacitor structures may be formed from the layers of metal used in forming the upper and lower gates and other conductive structures.

15 Claims, 4 Drawing Sheets

ORGANIC LIGHT-EMITTING DIODE DISPLAY WITH DOUBLE GATE TRANSISTORS

BACKGROUND

This relates generally to displays, and, more particularly, to organic light-emitting diode displays.

Electronic devices often include displays. Organic light-emitting diode displays may exhibit desirable attributes such as a wide field of view, compact size, and low power consumption.

Organic light-emitting diode displays have arrays of pixels. Each pixel may contain an organic light-emitting diode and thin-film transistor circuitry that that controls current flow through the organic light-emitting diode. Storage capacitors may be used to store data between successive image frames.

It can be challenging to form an organic light-emitting diode display. If care is not taken, the structures that form the thin-film transistor circuitry for controlling the pixels may consume more area than desired, thereby restricting the amount of light-emitting area per pixel (i.e., limiting the aperture ratio of the pixels). It may also be difficult to form storage capacitors without consuming more area within a pixel than desired. Thin-film transistors may not always be as stable as desired.

It would therefore be desirable to be able to form an organic light-emitting diode display with enhanced aperture ratios, storage capacitor structures, and thin-film transistors.

SUMMARY

An organic light-emitting diode display may have an array of pixels. Each pixel may have an organic light-emitting diode and thin-film transistor circuitry that controls current flow through the organic light-emitting diode. The thin-film transistor circuitry may include silicon thin-film transistors and semiconducting oxide thin-film transistors.

Double gate transistor structures may be formed in the transistors of the thin-film transistor circuitry. A double gate transistor may have a semiconductor layer sandwiched between first and second dielectric layers. The first dielectric layer may be interposed between an upper gate and the semiconductor layer and the second dielectric layer may be interposed between a lower gate and the semiconductor layer. The upper gate may help prevent light from reaching the semiconductor layer. The use of dual gates allows the threshold voltage of a dual gate transistor to be adjusted to compensate for stress-induced threshold voltage shifts.

Capacitors may be formed in the thin-film transistor circuitry. The capacitors may have electrodes that are separated from each other by an intervening dielectric layer. The layers of metal used in forming the upper and lower gates and other conductive structures in the thin-film transistor circuitry may be used in forming capacitor electrodes.

Metal structures such as signal paths for initialization voltages may be formed using layers of metal other than an anode metal layer, thereby allowing the aperture ratio of the pixels to be enhanced.

DETAILED DESCRIPTION

Figure 1:
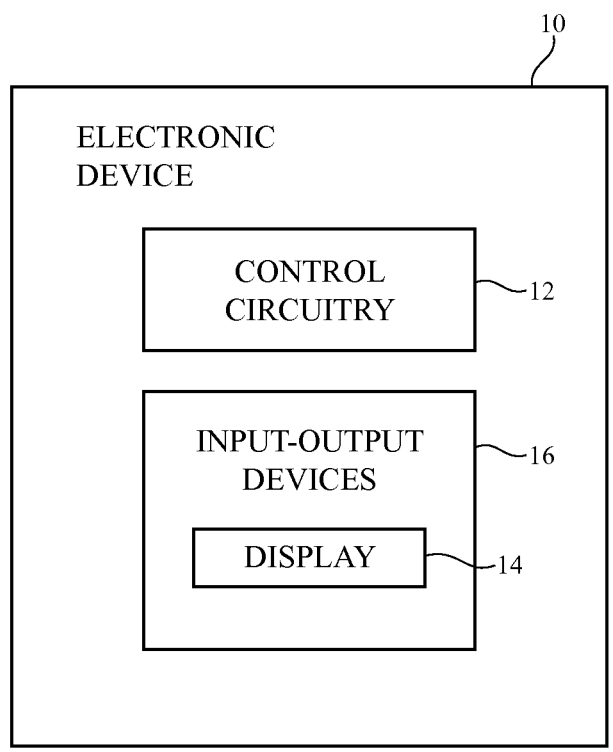
FIG. 1 is a diagram of an illustrative electronic device having a display in accordance with an embodiment.

An illustrative electronic device of the type that may be provided with an organic light-emitting diode display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14.

Figure 2:
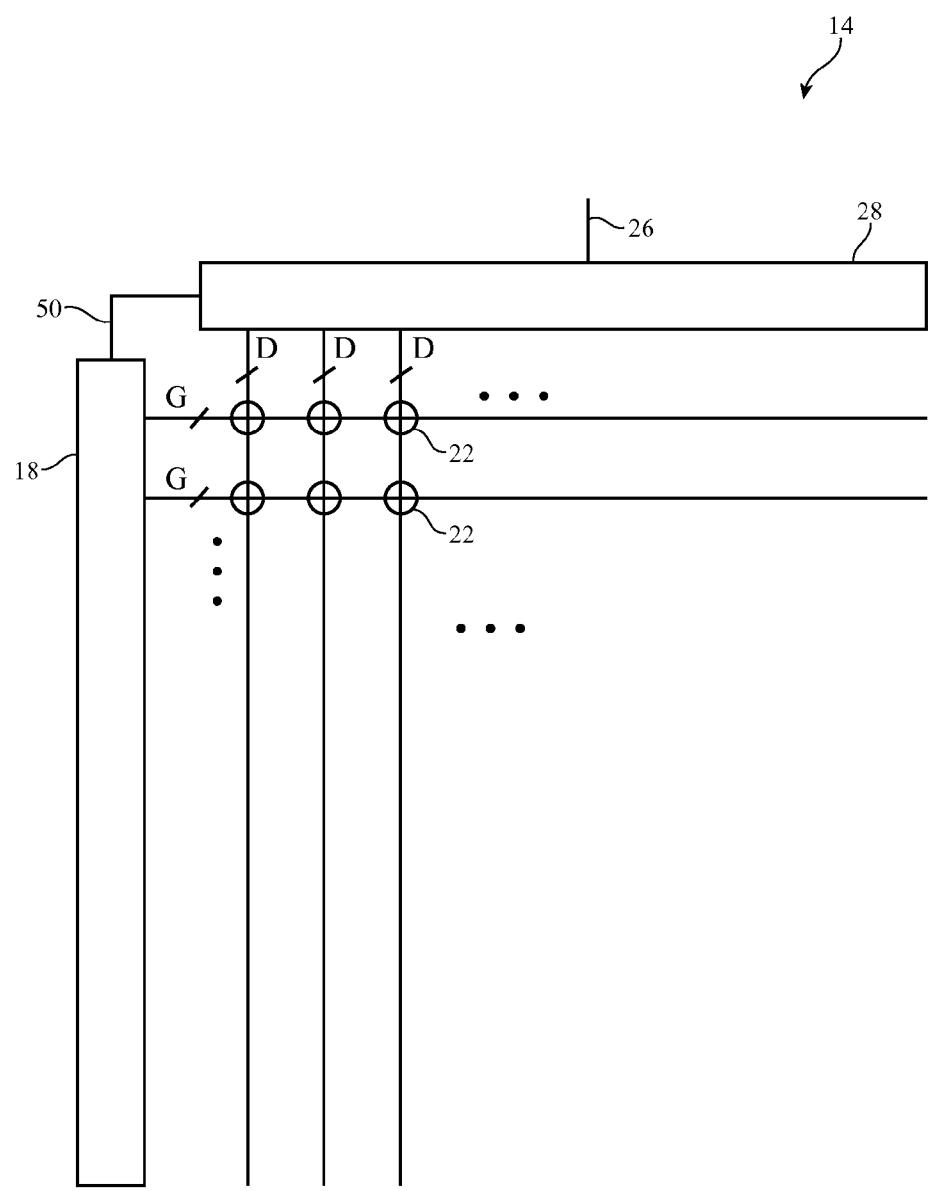
FIG. 2 is a diagram of an illustrative display in accordance with an embodiment.

Display 14 may be an organic light-emitting diode display. FIG. 2 is a diagram of an illustrative organic light-emitting diode display. As shown in FIG. 2, display 14 may have an array of pixels 22 for displaying images for a user. The array of pixels 22 may be arranged to from rows and columns. There may be any suitable number of rows and columns in the array of pixels 22 (e.g., ten or more, one hundred or more, or one thousand or more). Pixels 22 may each contain subpixels of different colors. As an example, each pixel 22 may have a red subpixel that emits red light, a green subpixel that emits green light, and a blue subpixel that emits blue light. Configurations for display 14 that include subpixels of other colors may be used, if desired.

Display driver circuitry may be used to control the operation of pixels 22. The display driver circuitry may be formed from integrated circuits, thin-film transistor circuits, or other suitable circuitry. Display driver circuitry 28 of FIG. 2 may contain communications circuitry for communicating with system control circuitry such as control circuitry 16 of FIG. 1 over path 26. Path 26 may be formed from traces on a flexible printed circuit or other cable. During operation, the control circuitry (e.g., control circuitry 16 of FIG. 1) may supply circuitry 28 with information on images to be displayed on display 14.

To display the images on display pixels 22, display driver circuitry 28 may supply image data to data lines D while issuing clock signals and other control signals to supporting display driver circuitry such as gate driver circuitry 18 over path 50. If desired, circuitry 28 may also supply clock signals and other control signals to gate driver circuitry on an opposing edge of display 14.

Gate driver circuitry 18 (sometimes referred to as horizontal control line control circuitry) may be implemented as part of an integrated circuit and/or may be implemented using thin-film transistor circuitry. Horizontal control lines G in display 14 may gate line signals (scan line signals), emission enable control signals, and other horizontal control signals for controlling the pixels of each row. There may be any suitable number of horizontal control signals per row of pixels 22 (e.g., one or more, two or more, three or more, four or more, etc.).

Each column of pixels 22 preferably includes a sufficient number of data lines to supply image data for all of the subpixels of that column (e.g., a red data line for carrying red data signals to red subpixels, a green data line for carrying green data signals to green subpixels, and a blue data line for carrying blue data signals to blue subpixels).

The circuitry for each subpixel may include an organic light-emitting diode, a drive transistor that controls current flow through the diode, and supporting transistors (e.g., switching transistors and emission enable control transistors). The supporting transistors (which may sometimes be referred to as switching transistors) may be used in performing data loading operations and threshold voltage compensation operations for the drive transistors. Each subpixel may have one or more capacitors. Storage capacitors may be used to store data signals between successive frames of data.

Figure 3:
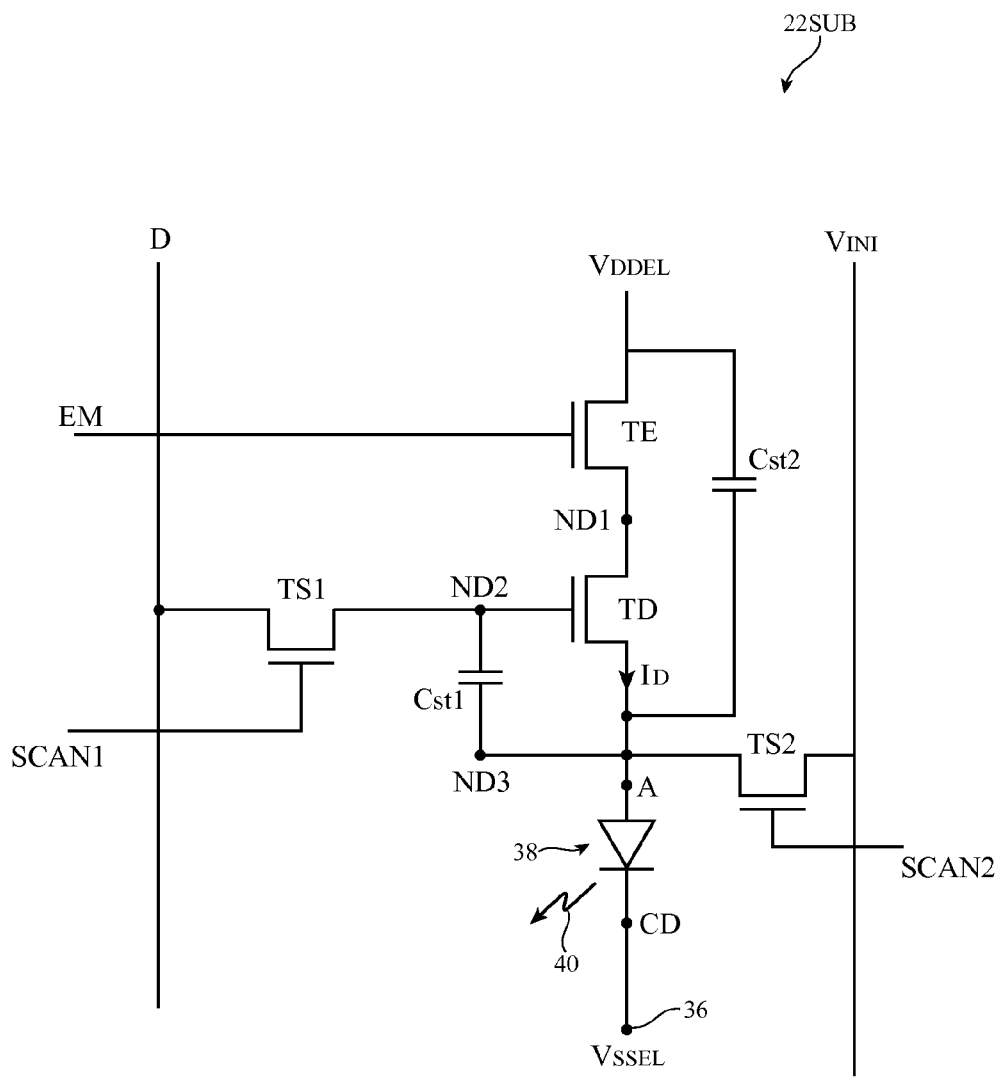
FIG. 3 is a diagram of an illustrative organic light-emitting diode pixel circuit in accordance with an embodiment.

A schematic diagram of an illustrative circuit for an organic light-emitting diode subpixel (pixel) is shown in FIG. 3. As shown in FIG. 3, each subpixel 22SUB may include an organic light-emitting diode such as organic light-emitting diode 38. Light-emitting diode 38 may emit colored light. For example, in a scenario in which subpixel 22SUB is a red subpixel, organic light-emitting diode 38 may emit red light. Blue subpixels may have blue diodes 38 that emit blue light and green subpixels may have green diodes 38 that emit green light. Arrangements for pixel 22 in which subpixels 22SUB have different colors (yellow, white, light blue, dark blue, etc.) may also be used.

In each subpixel 22SUB, the state of drive transistor TD controls the amount of drive current $I_D$ flowing through diode 38 and therefore the amount of emitted light 40 from subpixel 22SUB. Each diode 38 has an anode A and a cathode CD. Drive current $I_D$ flows between anode A and cathode CD. Cathode CD of diode 38 is coupled to ground terminal 36, so cathode terminal CD of diode 38 may sometimes be referred to as the ground terminal for diode 38. Cathode CD may be shared among multiple diodes (i.e., the cathodes CD of multiple diodes may be tied to a shared voltage). Each anode A may be individually driven by a respective drive transistor TD.

To ensure that transistor 38 is held in a desired state between successive frames of data, subpixel 22SUB may include a storage capacitor such as storage capacitor Cst1. The voltage on storage capacitor Cst1 is applied to the gate of transistor TD at node ND2 to control transistor TD (i.e., to control the magnitude of drive current $I_D$).

Data can be loaded into storage capacitor Cst1 using one or more switching transistors. One or more emission enable transistors may be used in controlling the flow of current through drive transistor TD. In the example of FIG. 3, scan signals SCAN1 and SCAN2 are applied to the gates of switching transistors TS1 and TS2. The SCAN1 and SCAN2 signals are used for controlling transistors TS1 and TS2 during threshold voltage compensation operations and data loading operations. The emission control signal EM is used to control emission enable transistor TE (e.g., to enable or disable current flow through transistor TD).

Display driver circuitry 28 may supply initialization voltages to columns of pixels using vertical initialization voltages lines in each column. As shown in FIG. 3, initialization voltage line Vini may be used to supply an initialization voltage (i.e., a direct current bias voltage Vini) to terminal ND3 via transistor TS2 during threshold voltage compensation operations. Display driver circuitry 38 may use data line D to supply a reference voltage Vref to subpixel 22SUB during threshold voltage compensation operations. Subpixel 22SUB may receive a positive power supply voltage such as $V_{DDEL}$ and a ground power supply voltage such as $V_{SSEL}$. Stabilization capacitor Cst2 may be used to help stabilize node ND3 during threshold voltage compensation operations.

Using pixel circuitry of the type shown in FIG. 3, each subpixel (pixel) 22SUB may be compensated for pixel-to-pixel variations such as transistor threshold voltage variations in drive transistor TD. Compensation operations may be performed during a compensation period that includes an initialization phase and a threshold voltage generation phase. Following compensation (i.e., after the compensation operations of the compensation period have been completed), data may be loaded into the pixels. The data loading process, which is sometimes referred to as data programming, may take place during a programming period. In a color display, programming may involve demultiplexing data and loading demultiplexed data into red, green, and blue subpixels 22SUB (as an example). Following compensation and programming (i.e., after expiration of a compensation and programming period), the pixels of the row may be used to emit light. The period of time during which the pixels are being used to emit light (i.e., the time during which light-emitting diodes 38 emit light 40) is sometimes referred to as an emission period.

During the initialization phase, circuitry 18 may assert SCAN1 and SCAN2 (i.e., SCAN1 and SCAN2 may be taken high). This turns on transistors TS1 and TS2 so that reference voltage signal Vref from line D and initialization voltage signal Vini from the initialization voltage line are applied to nodes ND2 and ND3, respectively. During the threshold voltage generation phase of the compensation period, signal EM is asserted so that transistor TE is turned on and current $I_D$ flows through drive transistor TD to charge up the capacitance at node ND3. As the voltage at node ND3 increases, the current through drive transistor TD will be reduced because the gate-source voltage Vgs of drive transistor TD will approach the threshold voltage Vt of drive transistor TD. The voltage at node ND3 will therefore go to Vref−Vt. After compensation (i.e., after initialization and threshold voltage generation), data is programmed into the compensated display pixels. During programming, emission transistor TE is turned off by deasserting signal EM and a desired data voltage D is applied to node ND2 using data line D. The voltage at node ND2 after programming is display data voltage Vdata. The voltage at node ND3 rises because of coupling with node ND2. In particular, the voltage at node ND3 is taken to Vref−

Vt+(Vdata−Vref)*K, where K is equal to Cst1/(Cst1+Cst2+Coled), where Coled is the capacitance associated with diode 38.

After compensation and programming operations have been completed, the display driver circuitry of display 14 places the compensated and programmed pixels into the emission mode (i.e., the emission period is commenced). During emission, signal EM is asserted for each compensated and programmed subpixel to turn on transistor TE. The voltage at node ND3 goes to Voled, the voltage associated with diode 38. The voltage at node ND2 goes to Vdata+(Voled−(Vref−Vt)−(Vdata−Vref)*K. The value of Vgs−Vt for drive transistor TD is equal to the difference between the voltage Va of node ND2 and the voltage Vb of node ND3. The value of Va−Vb is (Vdata−Vref)*(1−K), which is independent of Vt. Accordingly, each subpixel 22SUB in the array of pixels in display 14 has been compensated for threshold voltage variations so that the amount of light 40 that is emitted by each subpixel 22SUB is proportional only to the magnitude of the data signal D for each of those subpixels.

The illustrative pixel circuit of FIG. 3 uses four transistors and two capacitors and may therefore sometimes be referred to as a 4T2C design. If desired, other pixel circuitry may be used in display 14 (e.g., 6T1C designs, etc.). The configuration of FIG. 3 is merely illustrative.

Figure 4:
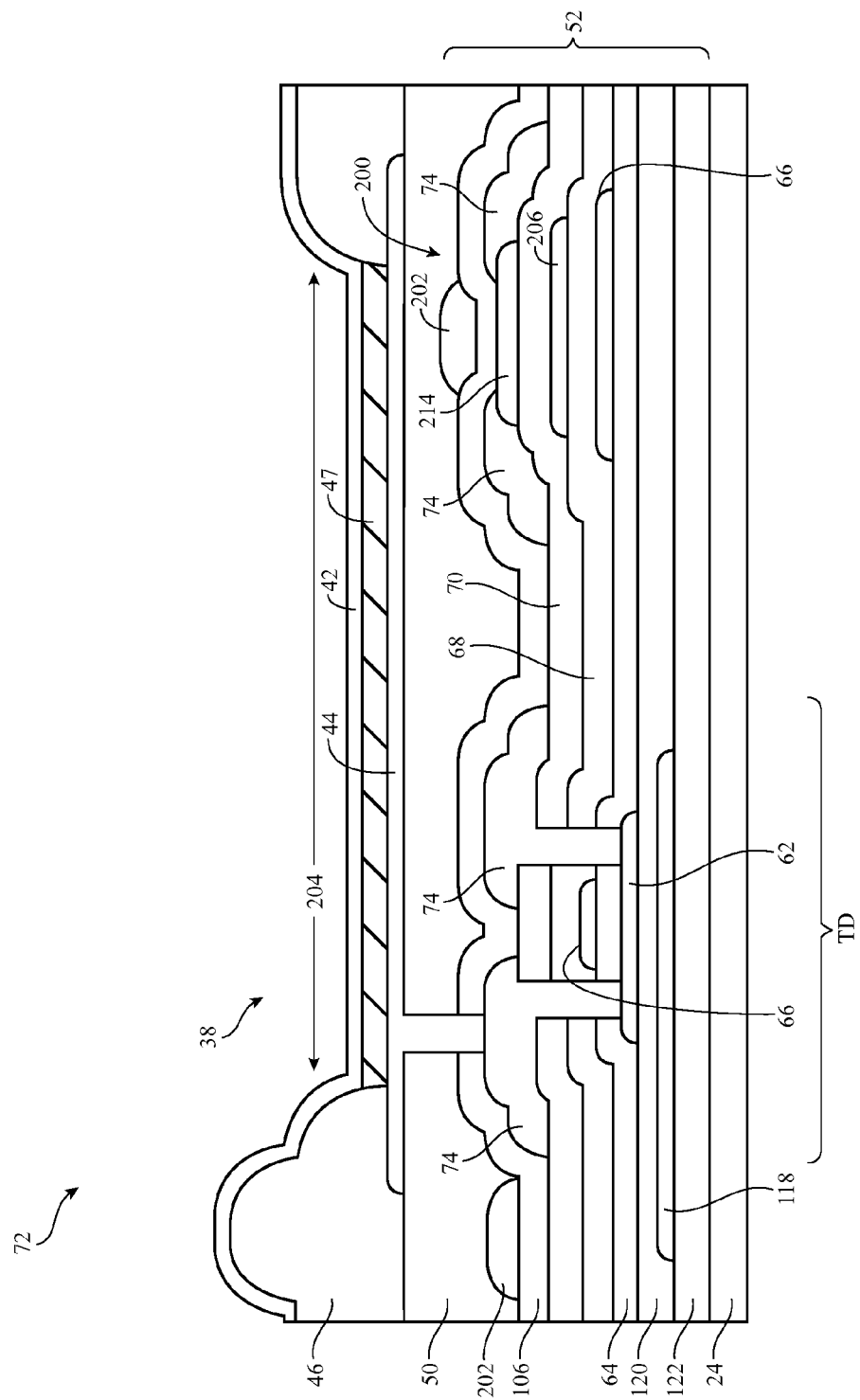
FIG. 4 is a cross-sectional side view of an organic light-emitting diode and associated thin-film structures for a pixel circuit in accordance with an embodiment.

Organic light-emitting diode pixels such as subpixel 22SUB of FIG. 3 may use thin-film transistor structures of the type shown in FIG. 4. As shown in FIG. 4, pixel circuitry 72 may include pixel structures such as light-emitting diode cathode layer 42 (e.g., a transparent conductive layer such as a layer of indium tin oxide that forms cathode terminal CD of FIG. 3) and light-emitting diode anode layer 44 (e.g., a patterned metal layer that forms anode terminal A of FIG. 3). Organic light-emitting diode emissive material 47 may be interposed between cathode 42 and anode 44, thereby forming light-emitting diode 38.

Dielectric layer 46 may have an opening that serves to define the layout of the light-emitting diode for each subpixel (e.g., alignment of the emissive material 47 with respect to anode 44) and may sometimes be referred to as a pixel definition layer. Planarization layer 50 (e.g., an organic polymer layer) may be formed on top of thin-film transistor structures 52. Thin-film transistor structures 52 may be formed on substrate 24. Substrate 24 may be rigid or flexible and may be formed from glass, ceramic, crystalline material such as sapphire, polymer (e.g., a flexible layer of polyimide or a flexible sheet of other polymer material), etc.

Thin-film transistor structures 52 may include thin-film transistors such as silicon transistors and/or thin-film transistors formed from other semiconductors (e.g., semiconducting oxides such as indium gallium zinc oxide). Semiconducting oxide transistors and silicon transistors tend to have different characteristics (e.g., mobility and switching speed, stability, leakage current, etc.), so it may be advantageous for pixel circuits in display 14 to use silicon transistors for some operations and semiconducting oxide transistors for other operations. In the illustrative configuration of FIG. 4, circuitry 72 includes a first transistor such as transistor 200 (e.g., a switching transistor such as one of transistors TS2, TS3, and TE of FIG. 3) that has been implemented as a semiconducting oxide transistor and a second transistor such as drive transistor TD that has been implemented as a silicon transistor. In general, pixel circuit switching transistors may be formed from silicon transistors, semiconducting oxide transistors, and/or a mixture of both silicon and semiconducting oxide transistors and pixel circuit drive transistors may be formed from silicon transistors or semiconducting oxide transistors. The illustrative configuration of FIG. 4 in which drive transistor TD is a silicon transistor and transistor 200 is a semiconducting oxide transistor is merely illustrative.

Transistor TD has a semiconductor layer (sometimes referred to as an active layer or active region) such as polysilicon silicon layer 62. Transistor 200 has a semiconductor layer such as an indium gallium zinc oxide layer or other semiconducting oxide layer 214. Layer 62 may be covered by gate insulator layer 64 (e.g., a layer of silicon oxide or other inorganic layer). Gate layer 66 may be patterned to form a gate for transistor TD. As shown in FIG. 4, gate layer 66 of transistor TD forms a transistor gate that overlaps semiconductor layer 62 and that is separated from semiconductor layer 62 by gate insulator 64. Gate layer 66 may be a layer of metal (e.g., molybdenum). Gate insulator 64 may be formed from an inorganic dielectric such as silicon oxide, silicon nitride, oxynitride, other inorganic materials, or layers of two or more of these materials.

Gate layer 66 may be covered by a layer of interlayer dielectric (e.g., a silicon oxide layer and/or a silicon nitride layer, other inorganic dielectric, etc.). For example, gate layer 66 may be covered by interlayer dielectric layers 68 and 70. Layer 68 may be a layer of silicon nitride (or silicon oxide) and layer 70 may be a layer of silicon oxide (or silicon nitride). Source-drain layer 74 may be a layer of metal that is patterned to form transistor source-drain terminals for transistors in circuitry 72 such as transistors 200 and TD. Each transistor may have a pair of source-drain terminals connected to opposing sides of the semiconductor layer of that transistor.

Circuitry 72 may also include capacitor structures such as capacitors Cst1 and Cst2 of FIG. 3. The capacitor structures may have electrodes that are formed from conducting layers in circuitry 72. The electrodes may be separated by an interposed dielectric layer (e.g., one or more of the dielectric layers of FIG. 4).

A passivation layer such as inorganic passivation layer 106 may be interposed between polymer (organic) passivation layer 50 and source-drain layer 74 (and dielectric layer 70). Layer 106 may be formed from silicon oxide, silicon nitride, or other dielectric.

Buffer layer 122 may be formed on substrate 24. Buffer layer 122 may be formed from one or more layers of inorganic dielectric material such as silicon oxide, silicon nitride, oxynitride, or other dielectric materials. Layer 122 may help to block impurities from substrate 24 (e.g., glass impurities) and thereby prevent these impurities from degrading the performance of the thin-film transistors of thin-film transistor circuitry 52.

Back-side metal layer 118 may be formed under thin-film transistors in circuitry 72 (e.g., silicon transistor TD in the example of FIG. 4) to serve as a shield layer that shields the transistors from charge in buffer layer 122. Buffer layer 120 may be formed over shield layer 118 and may be formed from a dielectric (e.g., an organic or inorganic dielectric layer).

To help enhance the aperture ratio of the pixels of display 14, anode layer 44 can be used exclusively or nearly exclusively for forming anodes A. With this type of approach, additional signal paths for display 14 such as the initialization voltage lines Vini in display 14 can be formed using portions of other metal layers and need not be formed from the metal of the anode layer.

In the example of FIG. 4, for example, circuitry 72 has been provided with additional metal layer 202. Metal layer 202 is interposed between dielectric layers 106 and 50. Because layer 202 is not formed in same layer of material as anode layer 44, there is additional space available in anode layer 44 for forming organic light-emitting diodes 38. This allows the size of openings such as opening 204 in pixel definition layer 46 and the lateral dimensions of anodes A formed from anode layer 44 to be increased without risk of creating undesired short circuit paths between anode A and the initialization voltage line or other signal paths. The increased size of opening 204 and associated increase in size of the anode and emissive layer material 47 in diode 38 increases pixel aperture ratio (e.g., subpixels 22SUB such as blue subpixels and potentially other subpixels in display 14 can have an enhanced anode size and emissive layer size and can therefore emit more light than would otherwise be possible in a given pixel area).

Semiconducting oxide transistors such as transistor 200 of FIG. 4 have active regions formed from semiconducting oxide layers such as semiconducting oxide layer 214. Transistor 200 may have a double gate structure in which a first metal layer such as a portion of layer 202 forms an upper gate and in which a second metal layer such as gate layer 206 forms a lower gate. Upper gate 202 may be formed from a portion of the same metal layer that forms initialization voltage line Vini (as an example). As shown in FIG. 4, upper gate 202 in transistor 200 may be separated from semiconductor layer 214 by dielectric layer 106. Lower gate 206 may be formed from a patterned metal layer that is interposed between interlayer dielectric layer 70 and interlayer dielectric layer 68.

During operation, a first channel region may be formed along the upper surface of layer 214 and a second channel region may be formed along the opposing lower surface of layer 214. Transistor performance may be enhanced for transistor 200 in configurations in which the upper and lower dielectric layers such as layers 106 and 70 have comparable thicknesses so that the upper and lower channel regions produced in layer 214 are comparable in thickness. If desired, the lower gate for transistor 200 may be located below interlayer dielectric layer 68 (e.g., the lower gate may be formed from a portion of gate layer 66 and layer 206 can be omitted).

The upper and lower gates of transistors such as dual-gate transistor 200 in FIG. 4 may be electrically connected (e.g., using a via or other conductive path) or may be independently controlled. Voltage stress may alter the threshold voltage of transistor 200. With independently controllable gates, threshold voltage adjustments may be made to transistor 200 to counteract stress-induced threshold voltage shifts and thereby enhance transistor stability. The use of an upper gate structure such as gate 202 in transistor 200 may also help shield transistor 200 from visible and ultraviolet light that might otherwise disrupt transistor operation.

The conductive layers of FIG. 4 may, if desired, be used in forming capacitors for pixels 22 (see, e.g., Cst1 and Cst2 of FIG. 3).

With one suitable arrangement, a first capacitor electrode may be formed from a portion of semiconductor layer 62 and a second capacitor electrode may be formed from a portion of gate layer 66. Dielectric layer 64 may be interposed between the first and second electrodes to form a storage capacitor.

With another arrangement, a portion of gate layer 66 may form a first capacitor electrode and a portion of metal layer 206 may form a second capacitor electrode. Dielectric layer 70 may be interposed between the first and second electrodes to from a storage capacitor.

In another illustrative configuration, a portion of layer 206 may form a first capacitor electrode and a portion of layer 74 may form a second capacitor electrode. Dielectric layer 70 may be interposed between the first and second electrodes to form a storage capacitor.

A capacitor may also be formed using a portion of layer 74 to form a first capacitor electrode, a portion of metal layer 202 to form a second capacitor electrode, and using layer 106 to form a dielectric layer between the first and second electrodes.

The foregoing is merely illustrative and various modifications can be made by those skilled in the art without departing from the scope and spirit of the described embodiments. The foregoing embodiments may be implemented individually or in any combination.

What is claimed is:

1. A display, comprising:
an array of pixels each of which has an organic light-emitting diode having an anode and a cathode and each of which has thin-film transistor circuitry with transistors including at least one transistor having a semiconductor layer interposed between an upper gate and a lower gate, wherein the thin-film transistor circuitry includes a source-drain layer that forms source-drain terminals for the transistor, wherein the upper gate is formed from a metal layer, wherein a portion of the metal layer forms a first electrode for a capacitor, and wherein a portion of the source-drain layer forms a second electrode for the capacitor;
horizontal control lines that are coupled to gates in the transistors and that supply control signals to rows of the pixels in the array; and
data lines associated with columns of the pixels in the array.

2. The display defined in claim 1 wherein the thin-film transistor circuitry includes a first dielectric layer between the upper gate and the semiconductor layer and a second dielectric layer between the lower gate and the semiconductor layer.

3. The display defined in claim 2 wherein the first dielectric layer covers the source-drain terminals.

4. The display defined in claim 3 further comprising an additional transistor having source-drain terminals formed from the source-drain layer.

5. The display defined in claim 4 wherein the transistor comprises a semiconducting oxide transistor and wherein the semiconductor layer comprises a semiconducting oxide.

6. The display defined in claim 5 wherein the additional transistor comprises a silicon transistor having a silicon layer.

7. The display defined in claim 6 wherein the additional transistor has a gate formed from a gate layer and wherein the thin-film transistor circuitry comprises a gate insulator layer interposed between the gate and the silicon layer.

8. The display defined in claim 7 further comprising a third dielectric layer, wherein the second and third dielectric layers are interposed between the gate of the additional transistor and the source-drain layer.

9. The display defined in claim 8 wherein the lower gate is interposed between the second and third dielectric layers.

10. The display defined in claim 1 further comprising:
initialization voltage lines associated with columns of the pixels in the array, wherein in each pixel the transistor that has the semiconductor layer interposed between the upper gate and the lower gate couples one of the voltage initialization lines to the anode of the organic light-emitting diode in that pixel.

11. The display defined in claim 10 further comprising:
a metal anode layer that is patterned to form the anodes, wherein the thin-film transistor circuitry includes a metal layer that is not formed from a portion of the metal anode layer and that is patterned to form the voltage initialization lines.

12. An organic light-emitting diode pixel circuit, comprising:
- an organic light-emitting diode; and
- thin-film transistor circuitry including at least one silicon transistor and at least one semiconducting oxide transistor, wherein the semiconducting oxide transistor has an upper gate and a lower gate and has a semiconducting oxide layer between the upper gate and the lower gate.

13. The organic light-emitting diode pixel circuit defined in claim 12 further comprising a first dielectric layer between the upper gate and the semiconducting oxide layer and a second dielectric layer between the lower gate and the semiconducting oxide layer.

14. An organic light-emitting diode pixel circuit, comprising:
- a capacitor having first and second electrodes; and
- a thin-film transistor having a semiconductor layer, an upper gate, a first dielectric layer between the upper gate and the semiconductor layer, a lower gate, and a second dielectric layer between the lower gate and the semiconductor layer, wherein the second electrode and the lower gate are formed from first and second portions of a common metal layer.

15. The organic light-emitting diode pixel circuit defined in claim 14 wherein the semiconductor layer comprises a semiconducting oxide layer.

* * * * *